US009046908B2

(12) United States Patent
Gong et al.

(10) Patent No.: US 9,046,908 B2
(45) Date of Patent: Jun. 2, 2015

(54) CALIBRATION METHOD AND APPARATUS FOR CURRENT AND RESISTANCE

(71) Applicant: MediaTek Singapore Pte. Ltd., Singapore (SG)

(72) Inventors: Zhichao Gong, Beijing (CN); Hong-Sing Kao, Hsinchu County (TW)

(73) Assignee: MediaTek Singapore Pte. Ltd., Solaris, Singapore (SG)

( * ) Notice: Subject to any disclaimer, the term of this patent is extended or adjusted under 35 U.S.C. 154(b) by 0 days.

(21) Appl. No.: 14/225,460

(22) Filed: Mar. 26, 2014

(65) Prior Publication Data

US 2015/0022259 A1 Jan. 22, 2015

(30) Foreign Application Priority Data

Jul. 17, 2013 (CN) .......................... 2013 1 0299692

(51) Int. Cl.
*H03K 17/62* (2006.01)
*G05F 1/46* (2006.01)

(52) U.S. Cl.
CPC ........................................ *G05F 1/46* (2013.01)

(58) Field of Classification Search
CPC ........... G01R 35/00; G05F 1/46; G05F 1/613; G05F 1/614
USPC .......... 323/312, 315; 327/403, 404, 407, 408, 327/538, 543
See application file for complete search history.

(56) References Cited

U.S. PATENT DOCUMENTS

| | | | | |
|---|---|---|---|---|
| 4,827,260 | A * | 5/1989 | Sugawa et al. | 341/118 |
| 7,466,252 | B1 * | 12/2008 | Radulov et al. | 341/120 |
| 7,880,531 | B2 * | 2/2011 | Park | 327/538 |

* cited by examiner

*Primary Examiner* — Jeffrey Zweizig
(74) *Attorney, Agent, or Firm* — Winston Hsu; Scott Margo

(57) ABSTRACT

A calibration method and apparatus for current and resistance are provided, where the current calibration method includes: injecting at least one portion of a set of predetermined compensation currents into at least one of an output current of a first current source and an output current of a second current source, and dynamically adjusting a distribution of the at least one portion of the set of predetermined compensation currents until two monitored voltage drops are equal to each other, and recording a first compensation current configuration; exchanging the first and second current sources, and dynamically adjusting the distribution of the at least one portion of the set of predetermined compensation currents until the two monitored voltage drops are equal to each other, and recording a second compensation current configuration; and according to the first and second compensation current configurations, generating a resultant compensation current, for use of current compensation.

28 Claims, 12 Drawing Sheets

CALIBRATION METHOD AND APPARATUS FOR CURRENT AND RESISTANCE

BACKGROUND

The disclosed embodiments of the present invention relate to current and resistance compensation, and more particularly, to a calibration method and related apparatus for current and resistance.

In accordance with the related art, the transmitting end of the conventional communication system usually needs calibration processes for precision operation, especially certain current and resistance calibration. Typical current calibration methods, however, usually have some problems. For example, one of the typical current calibration methods needs to spend a lot of time upon simulation in the design phase, which can not be done for one more time after associated circuits are calibrated. For another example, another one of the typical current calibration methods needs high-cost hardware resources, such as high-resolution analog-to-digital converter(s) and high-speed computing circuit(s). For yet another example, yet another one of the typical current calibration methods needs a relatively increased chip area, thus resulting in increased associated cost. Therefore, there is a need for a novel method to enhance the control of current and resistance compensation under the condition of not introducing any side effects.

SUMMARY

One of the objectives of the present invention is to provide a calibration method and apparatus for current and resistance to solve the above-mentioned problems.

According to an embodiment of the present invention, a current calibration method is disclosed. The current calibration method is applied in an electronic device including at least one first current source and at least one second current source, and includes: temporarily outputting an output current of the at least one first current source and an output current of the at least one second current source to a first load and a second load, respectively, so as to monitor voltage drops of the first load and the second load respectively, and temporarily injecting at least one portion of a set of predetermined compensation currents into at least one of the output current of the at least one first current source and the output current of the at least one second current source, and dynamically adjusting a distribution of the at least one portion of the set of predetermined compensation currents until the voltage drop of the first load and the current drop of the second load are equal to each other, and recording a first compensation current configuration corresponding to the current distribution of the at least one portion of the set of predetermined compensation currents, wherein the set of predetermined compensation currents is generated by a set of predetermined compensation current sources respectively; temporarily outputting the output current of the at least one of first current source and the at least one of output current of the second current source to the second load and the first load, respectively, so as to monitor voltage drops of the first load and the second load respectively, and dynamically adjusting the distribution of the at least one portion of the set of predetermined compensation currents until the voltage drop of the first load and the voltage drop of the second load are equal to each other, and recording a second compensation current configuration corresponding to the current distribution of the at least one portion of the set of predetermined compensation currents; and controlling the set of predetermined compensation current sources to generate a resultant compensation current according to the first compensation current configuration and the second compensation current configuration, for use of compensating the at least one first current source or the at least one second current source, so as to calibrate the at least one first current source and the at least one second current source to be equivalent to each other.

At the same time, an associated current calibration apparatus is further provided, wherein the current calibration apparatus includes at least a portion of an electronic device, and the electronic device includes at least one first current source and at least one second current source, and the current calibration apparatus includes a set of predetermined compensation current sources, a first load and a second load, at least one switching module, and a calibration module. The set of predetermined compensation current sources is arranged for generating a set of predetermined compensation currents. The first load and a second load are arranged for performing current-to-voltage conversion respectively. The at least one switching module is coupled to the at least one first current source, the at least one second current source, the first load, the second load, and the set of predetermined compensation current sources, and arranged for performing path switching. The calibration module is coupled to the first load, the second load, and the at least one switching module, and arranged for performing calibration control, wherein the calibration module includes a voltage comparator. The voltage comparator is coupled to the first load and the second load, and arranged for performing voltage comparison. Wherein by utilizing the set of predetermined compensation current sources, the first load, the second load, the at least one switching module, and the voltage comparator, the calibration module temporarily outputs an output current of the at least one first current source and an output current of the at least one second current source to a first load and a second load, respectively, so as to monitor voltage drops of the first load and the second load respectively, temporarily injects at least one portion of a set of predetermined compensation currents into at least one of the output current of the at least one first current source and the output current of the at least one second current source, and dynamically adjusts a distribution of the at least one portion of the set of predetermined compensation currents until a voltage drop of the first load and a voltage drop of the second load are equal to each other, and then records a first compensation current configuration corresponding to the current distribution of the at least one portion of the set of predetermined compensation currents; temporarily outputs the output current of the at least one first current source and the output current of the at least one second current source to the second load and the first load, respectively, so as to monitor the voltage drops of the first load and the second load respectively; and dynamically adjusting the distribution of the at least one portion of the set of predetermined compensation currents until the voltage drop of the first load and the voltage drop of the second load are equal to each other, and then records a second compensation current configuration corresponding to the current distribution of the at least one portion of the set of predetermined compensation currents; and controls the set of predetermined compensation current sources to generate a resultant compensation current according to the first compensation current configuration and the second compensation current configuration, for use of compensating the at least one first current source or the at least one second current source, so as to calibrate the at least one first current source and the at least one second current source to be equivalent to each other.

According to another embodiment of the present invention, a resistance calibration method is disclosed. The resistance calibration method is employed in an electronic device including at least one first load and at least one second load, including: temporarily outputting an output current of a first current source and an output current of a second current source to the at least one first load and the at least one second load, respectively, so as to monitor voltage drops of the at least one first load and the at least one second load respectively; temporarily injecting at least one portion of a predetermined compensation resistance provided by a predetermined compensation resistance module into at least one of the at least one first load and the at least one second load; and dynamically adjusting a distribution of the at least one portion of the predetermined compensation resistance until a voltage drop of the first load and a voltage drop of the second load are equal to each other, and then recording a first compensation resistance configuration corresponding to the current distribution of the at least one portion of the predetermined compensation resistance; temporarily outputting the output current of the first current source and the output current of the second current source to the at least one second load and the at least one first load, respectively, so as to monitor the voltage drops of the at least one first load and the at least one second load respectively; and dynamically adjusting the distribution of the at least one portion of the predetermined compensation resistance until the voltage drop of the at least one first load and the voltage drop of the at least one second load are equal to each other, and then recording a second compensation resistance configuration corresponding to the current distribution of the at least one portion of the predetermined compensation resistance; and controlling the predetermined compensation resistance module to generate a resultant compensation resistance according to the first compensation resistance configuration and the second compensation resistance configuration, for use of compensating the at least one first load or the at least one second load, so as to calibrate the at least one first load and the at least one second load to be equivalent to each other.

At the same time, an associated resistance calibration apparatus is further provided, wherein the resistance calibration apparatus includes at least a portion of an electronic device, and the electronic device includes at least one first load and at least one second load, the resistance calibration apparatus comprises: a predetermined compensation resistance module, arranged for generating a predetermined compensation resistance; a first current source and a second current source, arranged for performing resistance-to-voltage conversion, respectively; at least one switching module, coupled to the at least one first load, the at least one second load, the first current source, the second current source, and the predetermined compensation resistance module, and arranged for performing path switching; and a calibration module, coupled to the at least one first load, the at least one second load, the predetermined compensation resistance module and the at least one switching module, and arranged for performing calibration control, wherein the calibration module comprises: a voltage comparator, coupled to the at least one first load and the at least one second load, and arranged for performing voltage comparison. Wherein by utilizing the predetermined compensation resistance module, the first current source, the second current source, the at least one switching module, and the voltage comparator, the calibration module temporarily outputs an output current of the at first current source and an output current of the second current source to the at least one first load and the at least one second load, respectively, so as to monitor voltage drops of the at least one first load and the at least one second load respectively, temporarily injects at least one portion of the predetermined compensation resistance into at least one of the at least one first load and the at least one second load, and dynamically adjusts a distribution of the at least one portion of the predetermined compensation resistance until a voltage drop of the first load and a voltage drop of the second load are equal to each other, and then records a first compensation resistance configuration corresponding to the current distribution of the at least one portion of the predetermined compensation resistance; temporarily outputs the output current of the first current source and the output current of the second current source to the at least one second load and the at least one first load, respectively, so as to monitor the voltage drops of the at lest one first load and the at least one second load respectively; and dynamically adjusting the distribution of the at least one portion of the predetermined compensation resistance until the voltage drop of the at least one first load and the voltage drop of the at least one second load are equal to each other, and then records a second compensation resistance configuration corresponding to the current distribution of the at least one portion of the predetermined compensation resistance; and controls the predetermined compensation resistance module to generate a resultant compensation resistance according to the first compensation resistance configuration and the second compensation resistance configuration, for use of compensating the at least one first load or the at least one second load, so as to calibrate the at least one first load and the at least one second load to be equivalent to each other.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
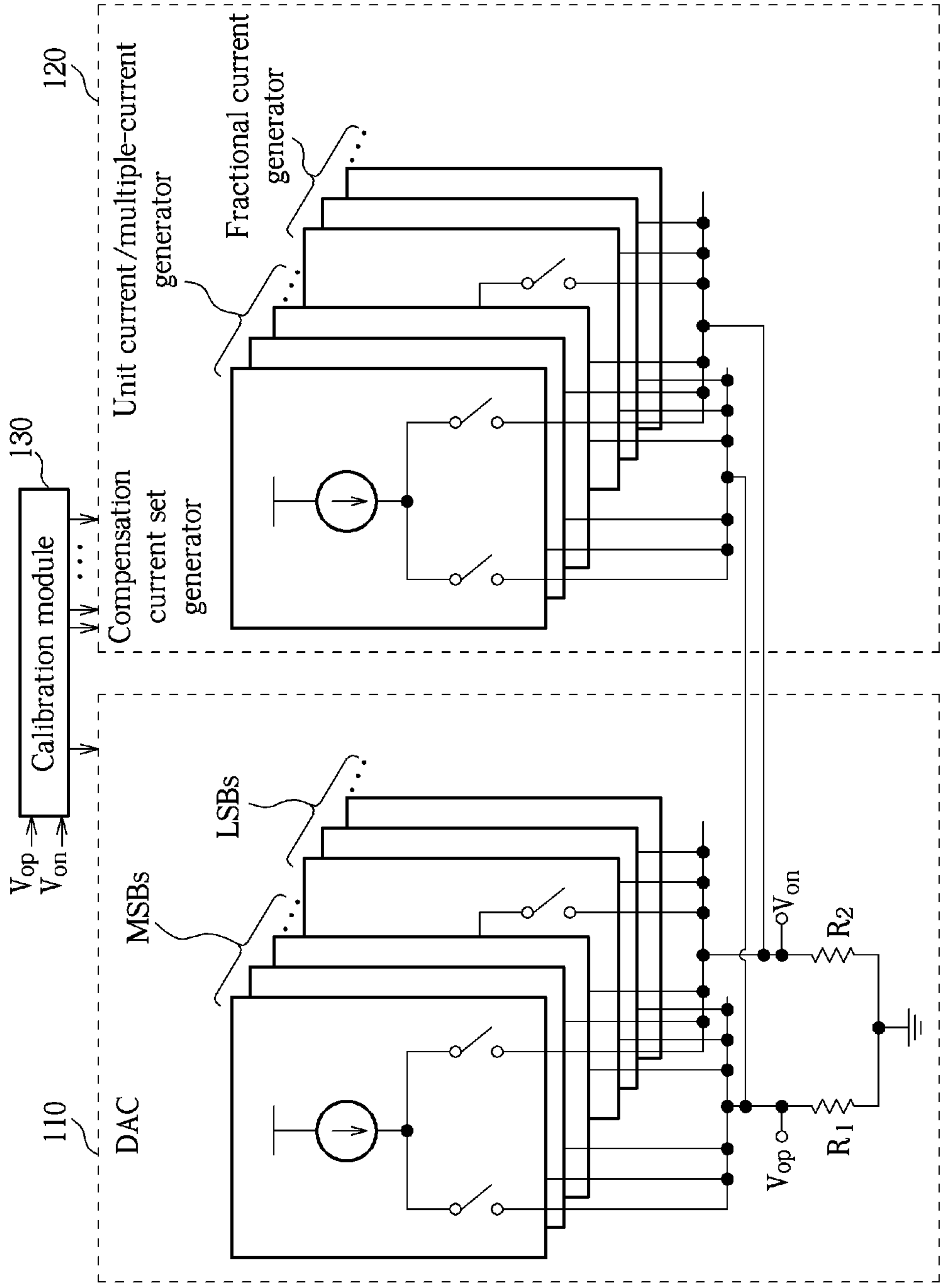
FIG. 1 is a current calibration apparatus according to a first embodiment of the present invention.

FIG. 1 is a current calibration apparatus 100 according to a first embodiment of the present invention, wherein the current calibration apparatus 100 includes at least a portion (e.g., part or all) of an electronic device, the electronic device includes at least one first current source and at least one second current source, and examples of the electronic device may include a multi-function mobile phone, a smartphone, a personal digital assistant, and a personal computer such as a laptop computer or a desktop computer. For example, the current calibration apparatus 100 is representative of a processing module of the electronic device, such as a processor of the electronic device. For another example, the current calibration apparatus 100 is representative of the overall electronic device. However, this is for illustrative purposes only, not a limitation of the present invention. According to an alternative design of the embodiment, the current calibration apparatus 100 is representative of a system containing the electronic apparatus, and the electronic apparatus is a subsystem of the system. Especially, the electronic apparatus could be an electronic device containing a current steering digital-to-analog converter (current steering DAC), wherein the current calibration apparatus 100 performs current calibration upon the above-mentioned current steering DAC; however, this is for illustrative purposes only, not a limitation of the present invention.

As shown in FIG. 1, the current calibration apparatus 100 includes at least one DAC 110, a compensation current set generator 120 and a calibration module 130; the at least one DAC 110, such as the aforementioned current steering DAC. The DAC 110 may include a plurality of current sources corresponding to a plurality of more significant bits (MSBs), respectively, and a plurality of current sources corresponding to a plurality of less significant bits (LSBs), respectively, wherein each of the current sources has a set of switching units correspondingly; the compensation current set generator 120 may include a set of predetermined compensation current sources, such as predetermined compensation current sources in a compensation current set generator 120 shown in FIG. 1, wherein the predetermined compensation current sources include a plurality of multiple-current generators respectively corresponding to a plurality of 'currents each with a multiple of unit current $I_{unit}$', a unit current generator corresponding to 'unit current $I_{unit}$', and a plurality of fractional current generators respectively corresponding to a plurality of 'currents each with a fraction of unit current $I_{unit}$', wherein each of the current sources possesses a set of switching units correspondingly; a first load such as a resistor $R_1$; a second load such as a resistor $R_2$, wherein terminals $V_{op}$ and $V_{on}$ are electrically connected to the upper terminals of the resistor $R_1$ and resistor $R_2$, respectively, and the lower terminals of the resistor $R_1$ and resistor $R_2$ are connected to ground, respectively; at least one switching module which includes each switching unit of the DAC 110 and each switching unit of the DAC 120, wherein the at least one switching module mentioned above is coupled to the plurality of current sources corresponding to a plurality of MSBs respectively, the plurality of current sources corresponding to a plurality of LSBs respectively, the first load such as the resistor $R_1$, the second load such as the resistor $R_2$, and the set of predetermined compensation current sources such as each of predetermined compensation current sources of the compensation current set generator 120; and a calibration module 130, which is coupled to the first load such as the resistor $R_1$, the second load such as the resistor $R_2$, and the at least one switching module mentioned above. More particularly, the calibration module may include a voltage comparator (not shown in FIG. 1) coupled to terminals $V_{op}$ and $V_{on}$ where the upper terminals of the first load and the second load respectively connect to.

For example, the at least one first current source may represent one or more current sources of the DAC 110 shown in FIG. 1, and the at least one second current source may represent one or more other current sources of the DAC 110 and one or more current sources of the compensation current set generator 120 shown in FIG. 1. However, this is for illustrative purposes only, not a limitation of the present invention.

According to this embodiment, the set of predetermined compensation current sources is utilized to generate a set of predetermined compensation currents, respectively, the first load and the second load are utilized to convert currents into voltages, respectively, and the at least one switching module is utilized to switch between different paths. The set of predetermined compensation currents may include (but not limited to): a unit current such as the above-mentioned unit current $I_{unit}$; a calibration unit current $I_{CAL\_unit}$, which could be equal to $0.125*I_{unit}$; and multiple predetermined compensation currents $\{I_{CAL\_bit\ (5)}, I_{CAL\_bit\ (4)}, I_{CAL\_bit\ (3)}, I_{CAL\_bit\ (2)}, I_{CAL\_bit\ (1)}, I_{CAL\_bit\ (0)}\}$, which could be equal to $\{(4*I_{unit}), (2*I_{unit}), (1*I_{unit}), (0.5*I_{unit}), (0.25*I_{unit}), (0.125*I_{unit})\}$ and correspond to different calibration bits {CAL_bit (5), CAL_bit (4), CAL_bit (3), CAL_bit (2), CAL_bit (1), CAL_bit (0)}, respectively. Please note that the above-mentioned current steering DAC may include at least one current source which can generate the aforementioned unit current $I_{unit}$. More particularly, the current steering DAC may include some current source to generate the unit current $I_{unit}$ and currents each with a multiple of the unit current $I_{unit}$. For example, the currents, each with a multiple of the unit current $I_{unit}$, may include multiple MSB currents $\{I_{MSB\ (7)}, I_{MSB\ (6)}, I_{MSB\ (5)}, I_{MSB\ (4)}, I_{MSB\ (3)}, I_{MSB\ (2)}, I_{MSB\ (1)}\}$ respectively corresponding to different MSBs {MSB (7), MSB (6), MSB (5), MSB (4), MSB (3), MSB (2), MSB (1)}, where the currents, which are determined by the designated purpose of the current steering DAC, may all have the same current value $256*I_{unit}$ and multiple LSB currents $\{I_{LSB\ (7)}, I_{LSB\ (6)}, I_{LSB\ (5)}, I_{LSB\ (4)}, I_{LSB\ (3)}, I_{LSB\ (2)}, I_{LSB\ (1)}\}$ respectively corresponding to different LSBs {LSB (7), LSB (6), LSB (5), LSB (4), LSB (3), LSB (2), LSB (1)}, wherein the currents may be equal to $\{(128*I_{unit}), (64*I_{unit}), (32*I_{unit}), (16*I_{unit}), (8*I_{unit}), (4*I_{unit}), (2*I_{unit}), (1*I_{unit})\}$, respectively. In practice, a specific predetermined compensation current source which is utilized for generating the unit current of the set of predetermined compensation currents maybe designed in accordance with the unit current $I_{unit}$ of the current steering DAC, wherein the set of predetermined compensation current sources may be designed and placed in the compensation current set generator 120 in advance based on demands so that various desired predetermined compensation currents can be obtained.

In addition, the voltage comparator (not shown in FIG. 1) in the calibration module 130 is utilized to perform voltage comparison, and the calibration module 130 is utilized to control the calibration process. Related details will be described in the following paragraphs.

Figure 2:
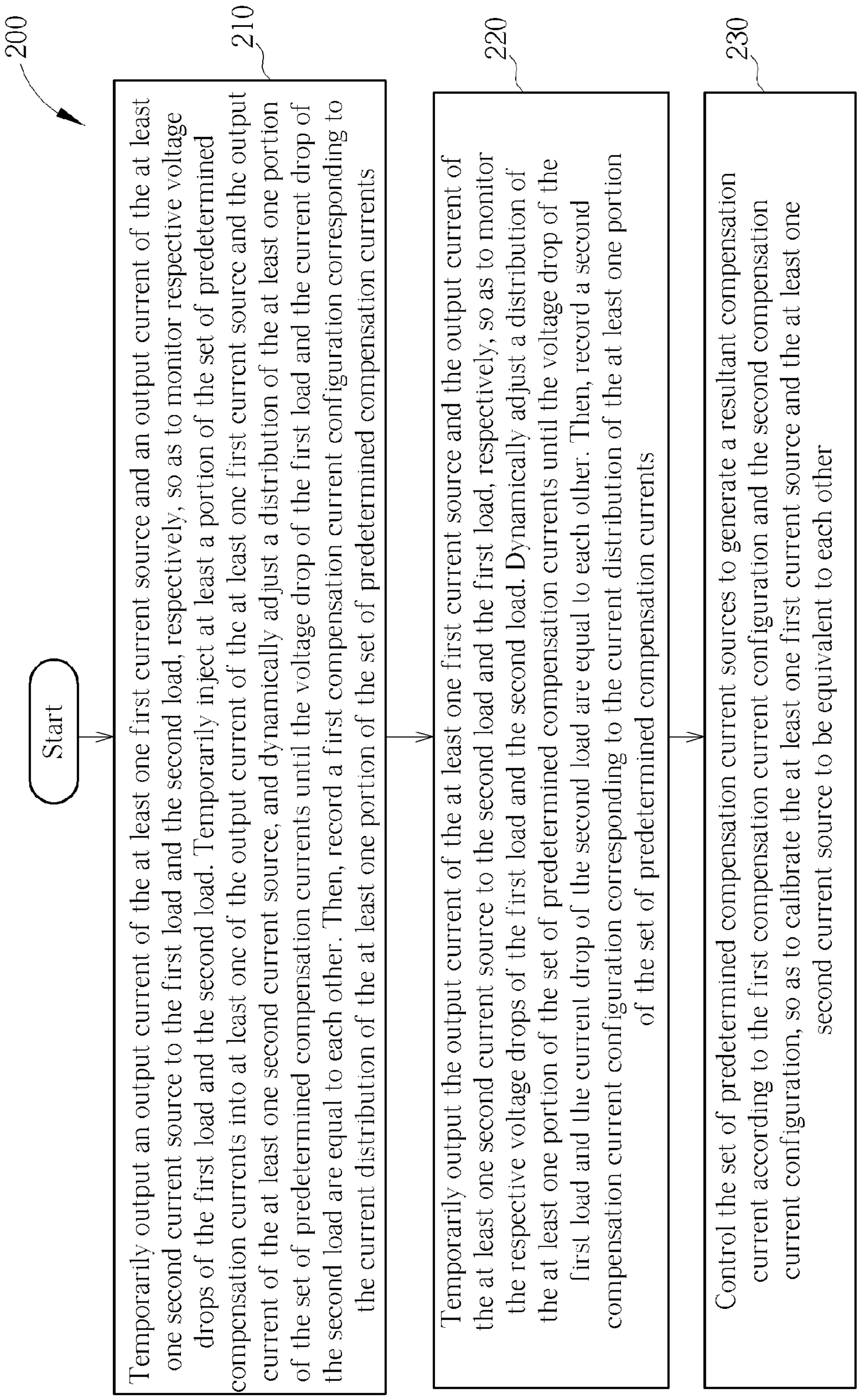
FIG. 2 is a flowchart illustrating a current calibration method according to an embodiment of the present invention.

FIG. 2 is a flowchart illustrating a current calibration method 200 according to an embodiment of the present invention. The method can be applied to the current calibration apparatus 100 shown in FIG. 1, especially the calibration module 130 in FIG. 1. The calibration module 130 can perform the current calibration method 200 via utilizing the set of predetermined compensation current sources, the first load, the second load, the above-mentioned at least one switching module, and the voltage comparator. The current calibration method 200 is described as follows.

In step 210, the calibration module 130 temporarily outputs an output current of the at least one first current source and an output current of the at least one second current source to the first load and the second load, respectively, by using at least a portion of the set of predetermined compensation current sources, the first load, the second load, the aforementioned at least one switching module and the voltage comparator, so as to monitor respective voltage drops of the first load and the second load. In addition, the calibration module 130 temporarily injects at least a portion of the set of predetermined compensation currents into at least one of the output current of the at least one first current source and the output current of the at least one second current source, and dynamically adjusts a distribution of the at least one portion of the set of predetermined compensation currents until the voltage drop of the first load and the current drop of the second load are equal to each other. Next, the calibration module 130 records a first compensation current configuration corresponding to the current distribution of the at least one portion of the set of predetermined compensation currents.

In step 220, the calibration module 130 temporarily outputs the output current of the at least one first current source and the output current of the at least one second current source to the second load and the first load, respective, by using at least a portion of the set of predetermined compensation current sources, the first load, the second load, the aforementioned at least one switching module, and the voltage comparator, so as to monitor the respective voltage drops of the first load and the second load. In addition, the calibration module 130 dynamically adjusts a distribution of the at least one portion of the set of predetermined compensation currents until the voltage drop of the first load and the current drop of the second load are equal to each other. Next, the calibration module 130 records a second compensation current configuration corresponding to the current distribution of the at least one portion of the set of predetermined compensation currents. Please note that the first compensation current configuration and the second compensation current configuration mentioned in current calibration method 200 are distinct to each other.

In step 230, the calibration module 130 controls the set of predetermined compensation current sources to generate a resultant compensation current according to the first compensation current configuration and the second compensation current configuration, where the resultant compensation current is used to compensate the at least one first current source or the at least one second current source, so as to calibrate the at least one first current source and the at least one second current source to be equivalent to each other.

According to this embodiment, the calibration module 130 generates a synthesized compensation current configuration according to the first compensation current configuration and the second compensation current configuration, and controls the set of predetermined compensation current sources to generate the resultant compensation current according to the synthesized compensation current configuration. In particular, the first compensation current configuration represents a first calibration bit configuration (e.g., a certain combination of various switching states of the switching units corresponding to different calibration bits {CAL_bit (5), CAL_bit (4), CAL_bit (3), CAL_bit (2), CAL_bit (1), CAL_bit (0)} respectively in the compensation current set generator 120), and the second compensation current configuration represents a second calibration bit configuration (e.g., a certain combination of various switching states of the switching units corresponding to different calibration bits {CAL_bit (5), CAL_bit (4), CAL_bit (3), CAL_bit (2), CAL_bit (1), CAL_bit (0)} respectively in the compensation current set generator 120), wherein the calibration module 130 can perform specific calculation upon the first calibration bit configuration and the second calibration bit configuration to generate a synthesized calibration bit configuration, and utilize the synthesized calibration bit configuration as the synthesized compensation current configuration. For instance, the above-mentioned specific calculation may include computation of a difference between the two compensation currents corresponding to the first calibration bit configuration and the second calibration bit configuration, respectively. In particular, the above-mentioned specific calculation is a subtraction operation directly performed upon the tow set of calibration bits respectively corresponding to the first calibration bit configuration and the second calibration bit configuration so that the synthesized compensation current configuration can be obtained correspondingly.

In addition, as discussed above, the set of predetermined compensation currents may include multiple predetermined compensation currents with different values, and a portion thereof is arranged for synthesizing the resultant compensation current, wherein the multiple predetermined compensation currents with different values correspond to different calibration bits, respectively. In particular, in a case where the electronic device includes the aforementioned current steering DAC, a range of the compensation currents represented by the calibration bits is different from a range of a plurality of partial currents represented by a plurality of bits of the current steering DAC. For example, as disclosed above, the compensation current represented by LSB of the calibration bits is smaller than the partial current represented by LSB of the plurality of bits of the current steering DAC.

Figure 3:
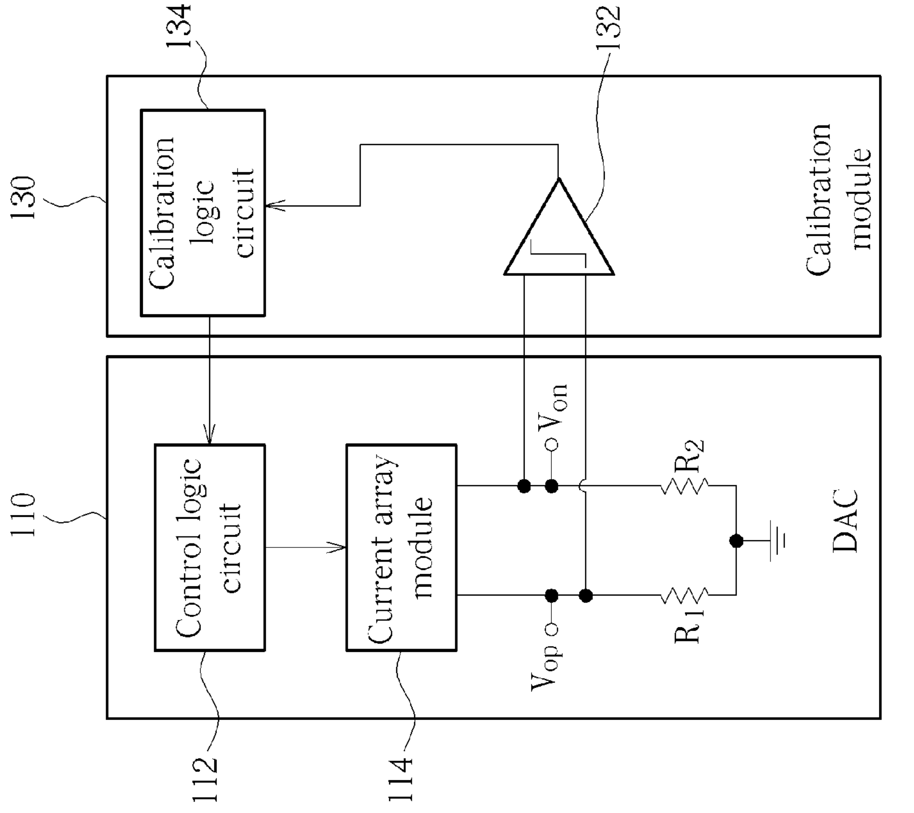
FIG. 3 is a diagram illustrating a practical architecture of an apparatus for implementing the current calibration method shown in FIG. 2 according to an embodiment of the present invention.

FIG. 3 is a diagram illustrating a practical architecture of an apparatus for implementing the current calibration method 200 shown in FIG. 2 according to an embodiment of the present invention. As can be seen in FIG. 3, the DAC 110 includes a control logic circuit 112 and a current array module 114, wherein the control logic circuit 112 controls the current array module 114 according to instruction of the calibration module 130, and the current array module 114 includes each current source in the DAC 110 shown in FIG. 1 and each set of switching units corresponding to the current source. In addition, the calibration module 130 includes the aforementioned voltage comparator such as a voltage comparator 132, and further includes a calibration logic circuit 134, wherein the voltage comparator 132 can be used to compare voltage levels of the terminals $V_{op}$ and $V_{on}$, and the calibration logic circuit 134 performs calibration control according to the comparison result outputted from the voltage comparator 132.

Figure 4:
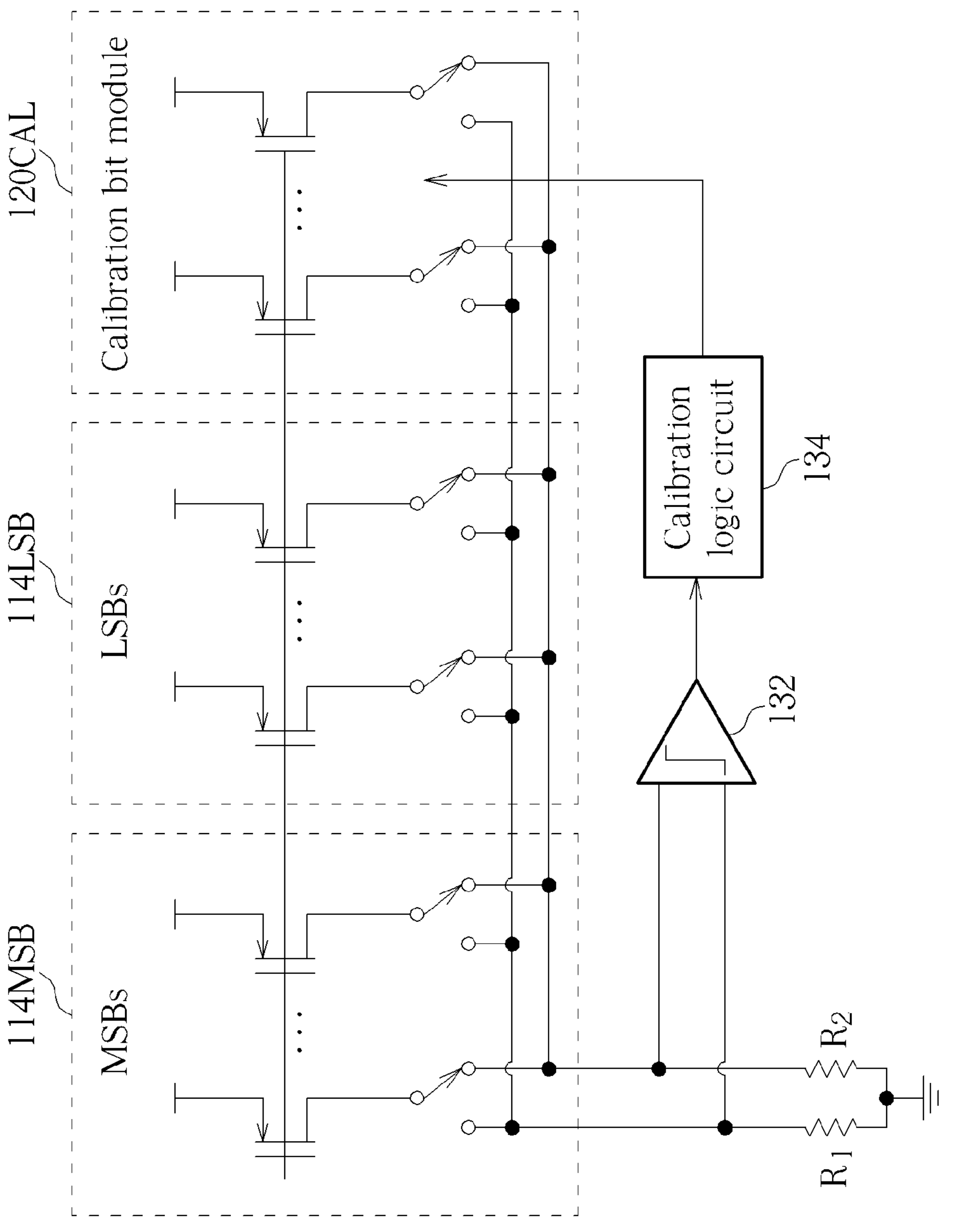
FIG. 4 is a diagram illustrating a practical architecture of an apparatus for implementing the current calibration method shown in FIG. 2 according to another embodiment of the present invention.

FIG. 4 is a diagram illustrating a practical architecture of an apparatus for implementing the current calibration method 200 shown in FIG. 2 according to another embodiment of the present invention. As can be seen in FIG. 4, the current array module 114 may include an MSB module 114MSB and an LSB module 114LSB, which respectively correspond to the above-mentioned MSB bits {MSB (7), MSB (6), MSB (5), MSB (4), MSB (3), MSB (2), MSB (1)} and the above-mentioned LSB bits {LSB (7), LSB (6), LSB (5), LSB (4), LSB (3), LSB (2), LSB (1)}, wherein the architecture of the MSB module 114MSB and the architecture of the LSB module 114LSB may be one of the embodiments of the architectures of the current sources corresponding to the MSBs and the current sources corresponding to the LSBs shown in FIG. 1 respectively. In addition, the compensation current set generator 120 may include a calibration bit module 120CAL with at least a portion of its architecture corresponding to the aforementioned calibration bits {CAL_bit (5), CAL_bit (4), CAL_bit (3), CAL_bit (2), CAL_bit (1), CAL_bit (0)}, wherein the architecture of the calibration bit module 120CAL may be one of the embodiments of the architecture of the current generators of the compensation current set generator 120 shown in FIG. 1.

Figure 5:
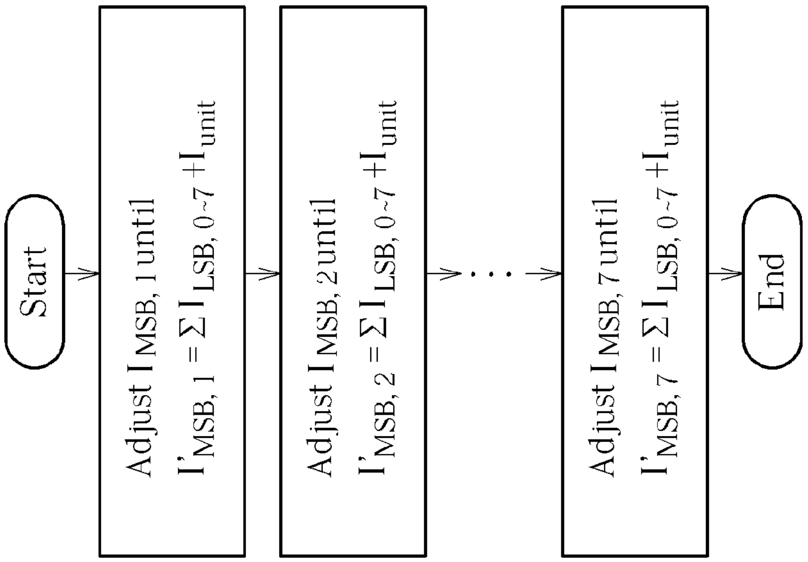
FIG. 5 is a diagram illustrating implementation details of the current calibration method shown in FIG. 2 according to another embodiment of the present invention.

FIG. 5 is a diagram illustrating implementation details of the current calibration method 200 shown in FIG. 2 according to another embodiment of the present invention. The workflow shown in FIG. 5 may be one of the embodiments of a partial workflow for the aforementioned MSB {MSB (7), MSB (6), MSB (5), MSB (4), MSB (3), MSB (2), MSB (1)} in the current calibration method 200, wherein the symbols $\{I_{MSB,7}, I_{MSB,6}, I_{MSB,5}, I_{MSB,4}, I_{MSB,3}, I_{MSB,2}, I_{MSB,1}\}$ of each step in FIG. 5 represent values of MSB currents $\{I_{MSB(7)}, I_{MSB(6)}, I_{MSB(5)}, I_{MSB(4)}, I_{MSB(3)}, I_{MSB(2)}, I_{MSB(1)}\}$ before, during, or after the adjustment, respectively. In particular, they represent the values of the MSB currents $\{I_{MSB(7)}, I_{MSB(6)}, I_{MSB(5)}, I_{MSB(4)}, I_{MSB(3)}, I_{MSB(2)}, I_{MSB(1)}\}$ before the adjustment, respectively. Besides, the symbols $\{I'_{MSB,7}, I'_{MSB,6}, I'_{MSB,5}, I'_{MSB,4}, I'_{MSB,3}, I'_{MSB,2}, I'_{MSB,1}\}$ of each step in FIG. 5 represent the adjustment values of MSB currents $\{I_{MSB(7)}, I_{MSB(6)}, I_{MSB(5)}, I_{MSB(4)}, I_{MSB(3)}, I_{MSB(2)}, I_{MSB(1)}\}$, respectively. Please note that the symbol '$\Sigma I_{LSB,0\sim7}$' represents the sum of all of the LSB currents $\{I_{LSB(7)}, I_{LSB(6)}, I_{LSB(5)}, I_{LSB(4)}, I_{LSB(3)}, I_{LSB(2)}, I_{LSB(1)}, I_{LSB(0)}\}$, that is, a sum obtained from changing the index value from 0 to 7; wherein the symbol '$\Sigma I_{LSB,0\sim7}$' is a simplified notation of $(I_{LSB,0}+I_{LSB,1}+I_{LSB,2}+I_{LSB,3}+I_{LSB,4}+I_{LSB,5}+I_{LSB,6}+I_{LSB,7})$, and the symbols $\{I_{LSB,7}, I_{LSB,6}, I_{LSB,5}, I_{LSB,4}, I_{LSB,3}, I_{LSB,2}, I_{LSB,1}, I_{LSB,0}\}$ represent the values of above-mentioned LSB currents $\{I_{LSB(7)}, I_{LSB(6)}, I_{LSB(5)}, I_{LSB(4)}, I_{LSB(3)}, I_{LSB(2)}, I_{LSB(1)}, I_{LSB(0)}\}$, respectively.

Please also refer to FIG. 3, according to this embodiment, the calibration module 130 can temporarily enable a first portion of the plurality of bits of the DAC 110 and temporarily disable a second portion of the plurality of bits of the DAC 110 by utilizing the control logic circuit 112. For instance, enabling the first portion of the plurality of bits of the DAC 110 may represent injecting the current sources corresponding to the first portion of the plurality of bits of the DAC 110 into the resistor $R_1$, and disabling the second portion of the plurality of bits of the DAC 110 may represent injecting the current sources corresponding to the second portion of the plurality of bits of the DAC 110 into the resistor $R_2$. However, this is only for illustrative purposes only, not a limitation of the present invention. According to an alternative design of the present invention, enabling the first portion of the plurality of bits of the DAC 110 may represent injecting the current sources corresponding to the first portion of the plurality of bits of the DAC 110 into the resistor $R_2$, and disabling the second portion of the plurality of bits of the DAC 110 may represent injecting the current sources corresponding to the second portion of the plurality of bits of the DAC 110 into the resistor $R_1$. In this embodiment, in a condition that the first portion of the bits is enabled and the second portion of the bits is disabled, the calibration module 130 may inject at least a portion of the set of predetermined compensation currents into at least one of the resistor $R_1$ and the resistor $R_2$, and detects the corresponding voltage drops. For example, the calibration module 130 could temporarily enable one or more calibration bits corresponding to the at least one portion of the set predetermined compensation currents (i.e., inject the at least one portion of the set of predetermined compensation currents into the resistor $R_1$), and temporarily disable one or more calibration bits corresponding to another portion of the set predetermined compensation currents (i.e., inject the another portion of the set of predetermined compensation currents into the resistor $R_2$), and detects the respective voltage drops of the resistors $R_1$ and $R_2$. As discussed above, the calibration module 130 can adjust the distribution of the at least one portion of the predetermined compensation currents dynamically until the voltage drop of the first load (e.g., resistor $R_1$) and the voltage drop of the second load (e.g., resistor $R_2$) are equal to each other, and then records the first compensation current configuration corresponding to the current distribution of the at least one portion of the predetermined compensation currents.

In addition, the calibration module 130 may temporarily enable the second portion of the plurality of bits, and temporarily disable the first portion of the plurality of bits. That is, the calibration module 130 may temporarily exchange the second portion and the first portion. In a condition that the second portion of the bits is enabled and the first portion of the bits is disabled, the calibration module 130 injects at least a portion of the set of predetermined compensation currents into at least one of the resistor $R_1$ and the resistor $R_2$, and detects the corresponding voltage drops. For example, the calibration module 130 could temporarily enable a calibration bit represented by the at least one portion of the set predetermined compensation currents (i.e., inject the at least one portion of the set of predetermined compensation currents into the resistor $R_1$), and temporarily disable a calibration bit represented by another portion of the set predetermined compensation currents (i.e., inject the another portion of the set of predetermined compensation currents into the resistor $R_2$), and detects the respective voltage drops of the resistors $R_1$ and $R_2$. As discussed above, the calibration module 130 can adjust the distribution of the at least one portion of the predetermined compensation currents dynamically until the voltage drop of the first load (e.g., resistor $R_1$) and the voltage drop of the second load (e.g., resistor $R_2$) are equal to each other, and then records the second compensation current configuration corresponding to the current distribution of the at least one portion of the predetermined compensation currents.

According to an embodiment of the present invention, such as an alternative design of the embodiment shown in FIG. 5, the calibration module 130 performs calibration control based on the following method. The details are described as follows.

First of all, the calibration module 130 utilizes the voltage comparator 132 to perform comparison operation, as shown in the following equation:

$$[I_{MSB,1}+I_{MSB,2}+I_{MSB,3}+I_{MSB,4}+(I_{CAL,bit5}+X_1)]*R_1+V_{offset}=[I_{MSB,5}+I_{MSB,6}+I_{MSB,7}+(\Sigma I_{LSB,0\sim7}+I_{unit})+(\Sigma I_{CAL,bit\,0\sim4}+I_{CAL\_unit}-X_1)]*R_2 \quad (1)$$

where the symbol '$V_{offset}$' is representative of the offset voltage of the voltage comparator 132 with a known magnitude, and the respective symbols '$R_1$' and '$R_2$' of the resistors $R_1$ and $R_2$ are representative of the resistance values of the resistors $R_1$ and $R_2$ respectively, the symbol '$\Sigma I_{CAL,\ bit\ 0\sim4}$' is a simplified notation of $(I_{CAL,\ bit0}+I_{CAL,\ bit1}+I_{CAL,\ bit2}+I_{CAL,\ bit3}+I_{CAL,\ bit4})$, and symbols $\{I_{CAL,\ bit5}, I_{CAL,\ bit4}, I_{CAL,\ bit3}, I_{CAL,\ bit2}, I_{CAL,\ bit1}, I_{CAL,\ bit0}\}$ are representative of the aforementioned multiple predetermined compensation currents $\{I_{CAL\_bit\ (5)}, I_{CAL\_bit\ (4)}, I_{CAL\_bit\ (3)}, I_{CAL\_bit\ (2)}, I_{CAL\_bit\ (1)}, I_{CAL\_bit\ (0)}\}$.

In general, the offset voltage $V_{offset}$ does not affect the disclosed calibration control of this embodiment. Please note that the voltage drops of the resistors $R_1$ and $R_2$ measured by the voltage comparator 132 are equal to each other when the equation above is established/satisfied, and the symbol '$X_1$' is representative of remaining error term(s) other than the predetermined compensation current $I_{CAL\_bit\ (5)}$ under the first compensation current configuration, where the remaining error term(s), such as one or more predetermined compensation currents of the predetermined compensation currents $\{I_{CAL\_bit\ (4)}, I_{CAL\_bit\ (3)}, I_{CAL\_bit\ (2)}, I_{CAL\_bit\ (1)}, I_{CAL\_bit\ (0)}\}$, can be determined by the dynamic adjustment process in step 210.

More specifically, the first compensation current configuration may represent that the predetermined compensation current $I_{CAL\_bit\ (5)}$ is injected into the resistor $R_1$, at least a portion of the predetermined compensation currents $\{I_{CAL\_bit\ (4)}, I_{CAL\_bit\ (3)}, I_{CAL\_bit\ (2)}, I_{CAL\_bit\ (1)}, I_{CAL\_bit\ (0)}\}$ (such as the aforementioned one or more predetermined compensation currents corresponding to equation (1)) is selectively injected into the resistor $R_1$, a combined current $(\Sigma I_{LSB,\ 0\sim7}+I_{unit})$ and a calibration unit current $I_{CAL\_unit}$ are injected into the resistor $R_2$, and the other portion of the predetermined compensation currents $\{I_{CAL\_bit\ (4)}, I_{CAL\_bit\ (3)}, I_{CAL\_bit\ (2)}, I_{CAL\_bit\ (1)}, I_{CAL\_bit\ (0)}\}$ is selectively injected into the resistor $R_2$. For example, the first compensation current configuration may represent that the predetermined compensation currents $\{I_{CAL\_bit\ (5)}, I_{CAL\_bit\ (3)}, I_{CAL\_bit\ (1)}, I_{CAL\_bit\ (0)}\}$ are injected into the resistor $R_1$, and the combined current $(\Sigma I_{LSB,\ 0\sim7}+I_{unit})$, the predetermined compensation currents $\{I_{CAL\_bit(4)}, I_{CAL\_bit\ (2)}\}$ and the calibration unit current $I_{CAL\_unit}$ are injected into the resistor $R_2$. For another example, the first compensation current configuration may represent that the predetermined compensation current $I_{CAL\_bit\ (5)}$ is injected into the resistor $R_1$, and the combined current $(\Sigma I_{LSB,\ 0\sim7}+I_{unit})$, the predetermined compensation currents $\{I_{CAL\_bit\ (4)}, I_{CAL\_bit\ (3)}, I_{CAL\_bit\ (2)}, I_{CAL\_bit\ (1)}, I_{CAL\_bit\ (0)}\}$ and the calibration unit current $I_{CAL\_unit}$ are injected into the resistor $R_2$. However, this is for illustrative purposes only, not a limitation of the present invention. According to some alternative designs of this embodiment, the predetermined compensation current $I_{CAL\_bit\ (5)}$ of the first compensation current configuration may be adjusted/changed. For instance, the first compensation current configuration may represent that the predetermined compensation currents $\{I_{CAL\_bit\ (3)}, I_{CAL\_bit\ (1)}, I_{CAL\_bit\ (0)}\}$ are injected into the resistor $R_1$, and the combined current $(\Sigma I_{LSB,\ 0\sim7}+I_{unit})$, the predetermined compensation currents $\{I_{CAL\_bit\ (5)}, I_{CAL\_bit\ (4)}, I_{CAL\_bit\ (2)}\}$ and the calibration unit current $I_{CAL\_unit}$ are injected into the resistor $R_2$. Those skilled in the art will readily observe that numerous modifications and alterations of the device and method may be made while retaining the teachings of the invention, which also fall within the scope of the present invention.

In practice, the MSB current $I_{MSB,\ 1}$ is representative of a current source which may be disposed in the DAC 110, and the current components of the combined current $(\Sigma I_{LSB,\ 0\sim7}+I_{unit})$ are representative of current sources which may be disposed in at least one of the DAC 110 and the compensation current set generator 120. However, this is for illustrative purposes only, not a limitation of the present invention. In practice, locations of current sources for calibration could be modified based on different design requirements.

Further, the calibration module 130 exchanges the current source represented by the MSB current $I_{MSB,\ 1}$ and the current sources represented by each current component of the combined current $(\Sigma I_{LSB,\ 0\sim7}+I_{unit})$, and then uses the voltage comparator 132 to perform comparison operation, thus obtaining the following equation.

$$[(\Sigma I_{LSB,0\sim7}+I_{unit})+I_{MSB,2}+I_{MSB,3}+I_{MSB,4}+(I_{CAL,bit5}+X_2)]*R_1+V_{offset}=[I_{MSB,5}+I_{MSB,6}+I_{MSB,7}+I_{MSB,1}+(\Sigma I_{CAL,bit\,0\sim4}+I_{CAL\_unit}-X_2)]*R_2 \quad (2)$$

Please note that the voltage drops of the resistors $R_1$ and $R_2$ measured by the voltage comparator 132 are equal to each other when the equation above is satisfied/established, and the symbol '$X_2$' is representative of remaining error term(s) other than the predetermined compensation current $I_{CAL\_bit\ (5)}$ under the second compensation current configuration, where the remaining error term(s), such as one or more predetermined compensation currents of the predetermined compensation currents $\{I_{CAL\_bit\ (4)}, I_{CAL\_bit\ (3)}, I_{CAL\_bit\ (2)}, I_{CAL\_bit\ (1)}, I_{CAL\_bit\ (0)}\}$, can be determined by the dynamic adjustment process in step 220. In general, the remaining error term $X_2$ could be irrelevant to the remaining error term $X_2$. That is, the aforementioned one or more predetermined compensation currents corresponding to equation (2) could be irrelevant to the aforementioned one or more predetermined compensation currents corresponding to equation (1).

More specifically, the second compensation current configuration may represent that the combined current $(\Sigma I_{LSB,\ 0\sim7}+I_{unit})$ and the predetermined compensation current $I_{CAL\_bit\ (5)}$ are injected into the resistor $R_1$ and at least a portion of the predetermined compensation currents $\{I_{CAL\_bit\ (4)}, I_{CAL\_bit\ (3)}, I_{CAL\_bit\ (2)}, I_{CAL\_bit\ (1)}, I_{CAL\_bit\ (0)}\}$ (such as the aforementioned one or more predetermined compensation currents corresponding to equation (2)) is selectively injected into the resistor $R_1$, a calibration unit current $I_{CAL\_unit}$ is injected into the resistor $R_2$, and the other portion of the predetermined compensation currents $\{I_{CAL\_bit\ (4)}, I_{CAL\_bit\ (3)}, I_{CAL\_bit\ (2)}, I_{CAL\_bit\ (1)}, I_{CAL\_bit\ (0)}\}$ is selectively injected into the resistor $R_2$. For example, the second compensation current configuration may represent that the combined current $(\Sigma I_{LSB,\ 0\sim7}+I_{unit})$ and the predetermined compensation currents $\{I_{CAL\_bit\ (5)}, I_{CAL\_bit\ (4)}, I_{CAL\_bit\ (3)}, I_{CAL\_bit\ (2)}, I_{CAL\_bit\ (1)}, I_{CAL\_bit\ (0)}\}$ are injected into the resistor $R_1$, and the calibration unit current $I_{CAL\_unit}$ is injected into the resistor $R_2$. For another example, the second compensation current configuration may represent that the combined current $(\Sigma I_{LSB,\ 0\sim7}+I_{unit})$ and the predetermined compensation currents $\{I_{CAL\_bit\ (5)}, I_{CAL\_bit\ (1)}\}$ are injected into the resistor $R_1$, and the calibration unit current $I_{CAL\_unit}$ and the predetermined compensation currents $\{I_{CAL\_bit\ (4)}, I_{CAL\_bit\ (3)}, I_{CAL\_bit\ (2)}, I_{CAL\_bit\ (0)}\}$ are injected into the resistor $R_2$. However, this is for illustrative purposes only, not a limitation of the present invention. According to some alternative designs of this embodiment, the predetermined compensation current $I_{CAL\_bit\ (5)}$ of the second compensation current configuration may be adjusted/changed. For instance, the second compensation current configuration may represent that the combined current ($\Sigma I_{LSB,\ 0\sim7}+I_{unit}$) and the predetermined compensation current $I_{CAL\_bit\ (1)}$ are injected into the resistor $R_1$, and the calibration unit current $I_{CAL\_unit}$ and the predetermined compensation currents $\{I_{CAL\_bit\ (5)}, I_{CAL\_bit\ (4)}, I_{CAL\_bit\ (3)}, I_{CAL\_bit\ (2)}, I_{CAL\_bit\ (0)}\}$ are injected into the resistor $R_2$. Those skilled in the art will readily observe that numerous modifications and alterations of the device and method may be made while retaining the teachings of the invention, which also fall within the scope of the present invention.

Next, the calibration module 130 can determine the synthesized compensation configuration according to the following equation (which is obtained via equation (1) minus equation (2)):

$$[I_{MSB,1}-(\Sigma I_{LSB,0-7}+I_{unit})+X_1-X_2]*(R_1+R_2)=0 \Rightarrow I_{MSB,1}=(\Sigma I_{LSB,0-7}+I_{unit})+(X_2-X_1)$$

According to the equation, ($X_2-X_1$) is the deviation between $I_{MSB,\ 1}$ and ($\Sigma I_{LSB,\ 0\sim7}+I_{unit}$) and can be utilized to calibrate $I_{MSB,\ 1}$, so as to make $I_{MSB,\ 1}$ and ($\Sigma I_{LSB,\ 0\sim7}+I_{unit}$) equal. The calibrated MSB current is as follows:

$$I'_{MSB,1}=I_{MSB,1}+(X_1-X_2).$$

Therefore, for MSB current $I_{MSB,\ 1}$ (i.e., $I_{MSB(1)}$), the calibration module 130 can generate the synthesized compensation current configuration based on the first compensation current configuration and the second compensation current configuration, and control the set of predetermined compensation current sources based on the synthesized compensation current configuration to generate the resultant compensation current, such as a resultant compensation current ($X_1-X_2$), so as to calibrate the MSB current $I_{MSB,\ 1}$ to $I'_{MSB,\ 1}$, that is to say, to calibrate the MSB current $I_{MSB,\ 1}$ to equal the combined current ($\Sigma I_{LSB,\ 0\sim7}+I_{unit}$). For ease of understanding, the resultant compensation current ($X_1-X_2$) of the MSB current $I_{MSB,\ 1}$ can be denoted as $D_{MSB\ (1)}$. Similarly, by utilizing the control logic circuit 112 and the calibration logic circuit 134, the calibration module 130 can interchange the current sources represented by the other MSB currents (e.g., $I_{MSB\ (7)}$, $I_{MSB\ (6)}$, $I_{MSB\ (5)}$, $I_{MSB\ (4)}$, $I_{MSB\ (3)}$ or $I_{MSB\ (2)}$) and the current sources represented by each of the current components of the of the combined current ($\Sigma I_{LSB,\ 0\sim7}+I_{unit}$), thereby obtaining the compensation currents corresponding to each of the MSB currents for calibration. In this way, the calibration module 130 can obtain the corresponding compensation currents $\{D_{MSB\ (7)}, D_{MSB\ (6)}, D_{MSB\ (5)}, D_{MSB\ (4)}, D_{MSB\ (3)}, D_{MSB\ (2)}, D_{MSB\ (1)}\}$ and the corresponding synthesized compensation current configuration for MSB currents $\{I_{MSB\ (7)}, I_{MSB\ (6)}, I_{MSB\ (5)}, I_{MSB\ (4)}, I_{MSB\ (3)}, I_{MSB\ (2)}, I_{MSB\ (1)}\}$. The similar/identical parts of this embodiment and the foregoing embodiments/alternative designs are not detailed again for brevity.

Furthermore, those skilled in the art will readily understand that the voltage drops of both sides of the equation in the above embodiment are not strictly equivalent to each other, but in a way in terms of approximately equivalent to each other by a deviation range. When the both sides of the equation are not equivalent to each other, the voltage comparator will output either one of the two constant values (a positive value and a negative value). Therefore, when the output of the voltage comparator reverses in respect of the minimum compensation unit current (i.e. the output turns into negative from positive or the output turns into positive from negative), the two inputs will be deemed as approximately equivalent to each other, namely the respective voltage drops across the first load and the second load are the same. The current deviation is less than the minimum compensation unit current.

Figure 6:
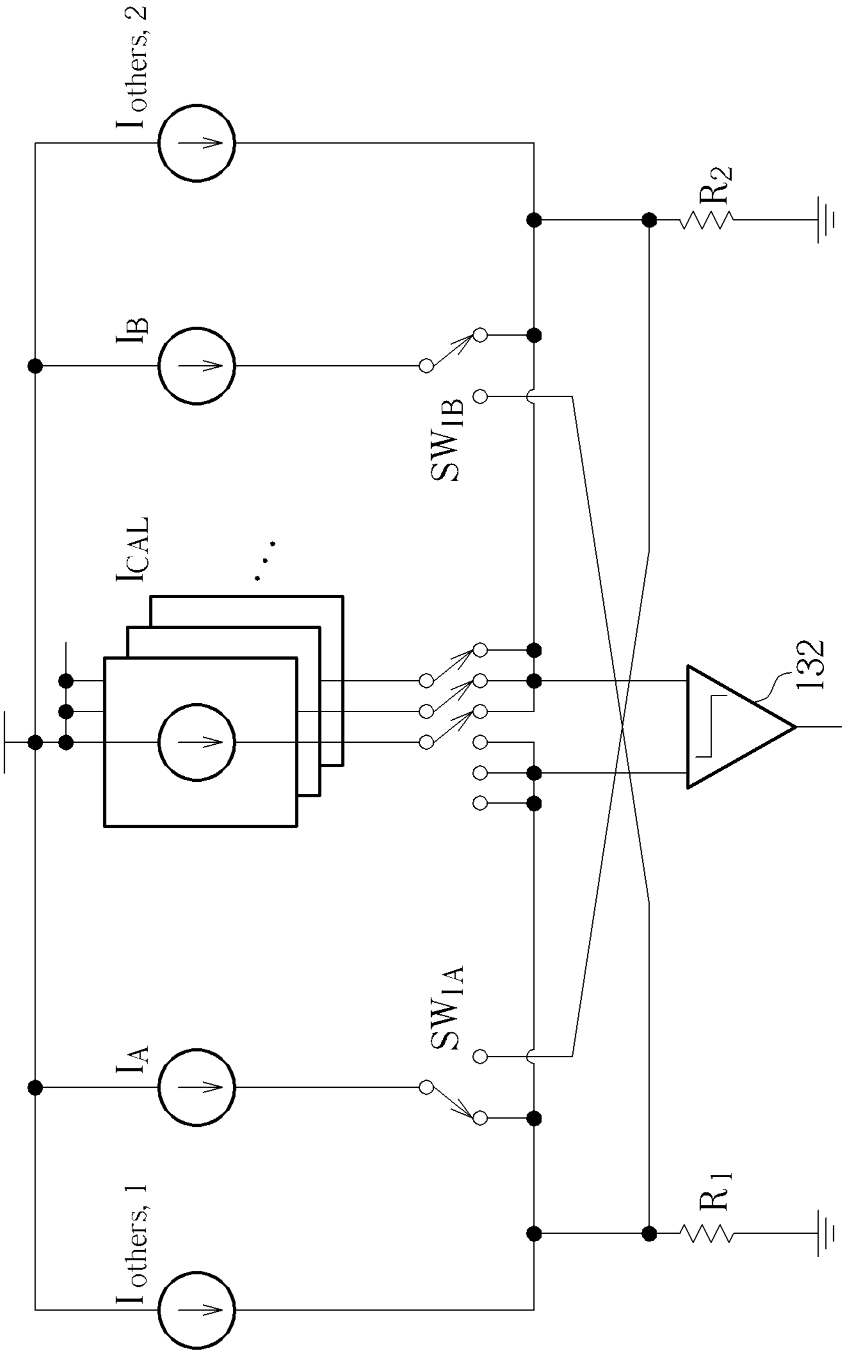
FIG. 6 is a diagram illustrating a current calibration apparatus according to a second embodiment of the present invention.

FIG. 6 is a diagram illustrating a current calibration apparatus according to a second embodiment of the present invention. This embodiment is an alternative design of at least a portion of the foregoing embodiments, wherein the current source $I_A$ is representative of the aforementioned at least one first current source, the current source $I_B$ is representative of the aforementioned at least one second current source, and the current sources $I_{others,\ 1}$, $I_{others,\ 2}$ are representative of other current sources respectively corresponding to the current source $I_A$ and $I_B$, such as equivalent current sources of respective noise currents of the current sources $I_A$ and $I_B$. In particular, the aforementioned set of predetermined compensation current sources $I_{CAL}$, may include several predetermined compensation current sources, the correspondingly outputted predetermined compensation current may be $\{I_{CAL\_bit\ (5)}, I_{CAL\_bit\ (4)}, I_{CAL\_bit\ (3)}, I_{CAL\_bit\ (2)}, I_{CAL\_bit\ (1)}, I_{CAL\_bit\ (0)}\}$ mentioned in the preceding paragraph, and the above-mentioned at least one switching module may include switching units $SW_{IA}$, $SW_{IB}$ and switching units below the predetermined compensation current source of the set of predetermined compensation current source $I_{CAL}$. Supposing the output current of the current source $I_A$ is regarded as the MSB current $I_{MSB,\ 1}$ (i.e. $I_{MSB\ (1)}$), and the output current of the current source $I_B$ is regarded as the combined current ($\Sigma I_{LSB,\ 0\sim7}+I_{unit}$), then according to the above-mentioned embodiment, the output current of the current source $I_A$ can be calibrated to equal the output current of the current source $I_B$ by interchanging the current sources $I_A$ and $I_B$. The similar/identical parts of this embodiment and the foregoing embodiments/alternative designs are not detailed again for brevity.

Figure 7:
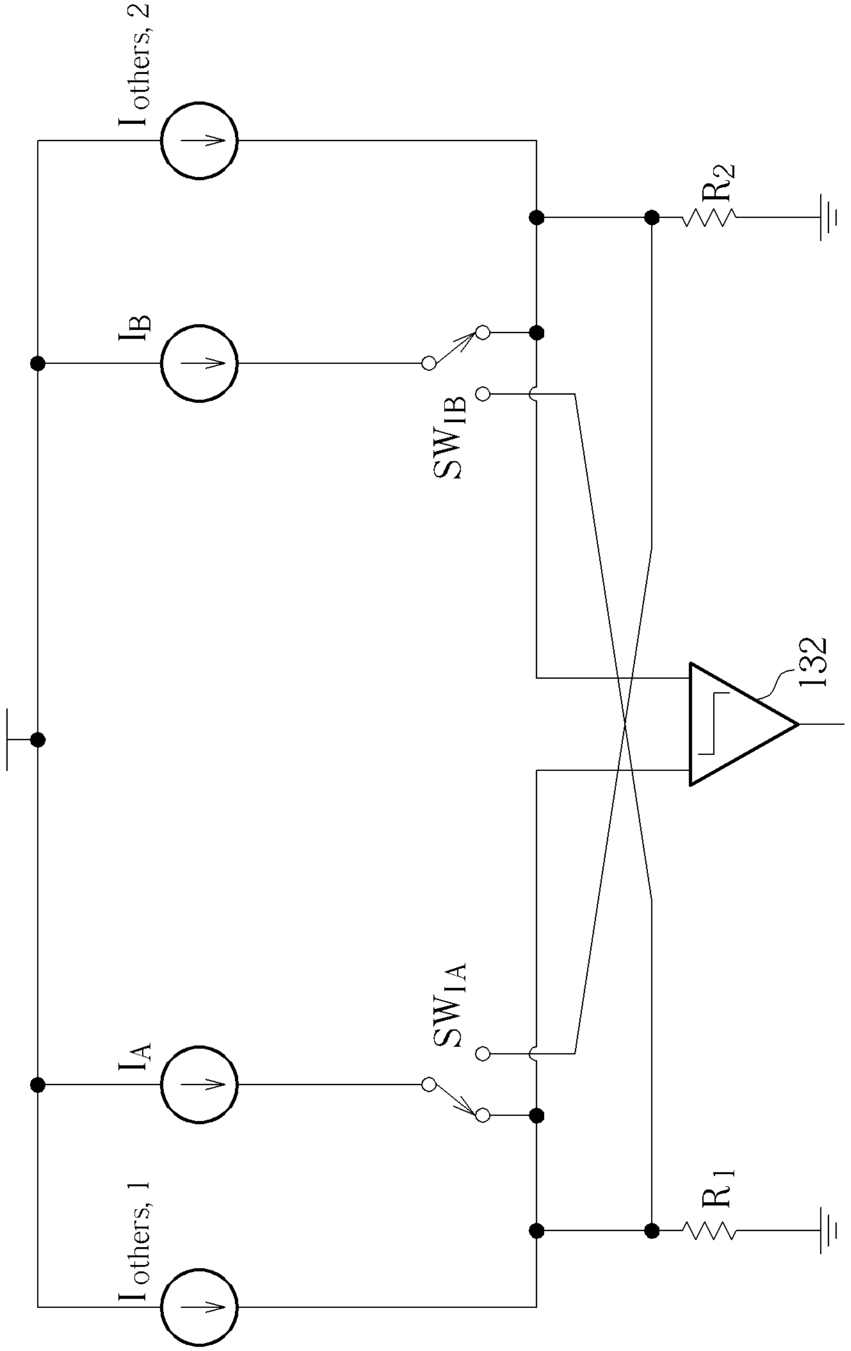
FIG. 7 is a diagram illustrating a current calibration apparatus according to a third embodiment of the present invention.

FIG. 7 is a diagram illustrating a current calibration apparatus according to a third embodiment of the present invention. This embodiment is an alternative design of at least a portion of the foregoing embodiments, wherein the current source $I_A$ is representative of the aforementioned at least one first current source, the current source $I_B$ is representative of the aforementioned at least one second current source, and the current sources $I_{others,\ 1}$, $I_{others,\ 2}$ are representative of other current sources respectively corresponding to the current source $I_A$ and $I_B$, such as equivalent current sources of respective noise currents of the current sources $I_A$, $I_B$. In the condition that the current source $I_A$ is a variable current source, the aforementioned set of predetermined compensation current sources can be regarded as built-in current sources of the current source $I_A$, and thus the aforementioned predetermined compensation current source $I_{CAL}$ can be omitted. Furthermore, the above-mentioned at least one switching module may include switching units $SW_{IA}$, $SW_{IB}$. The similar/identical parts of this embodiment and foregoing embodiments/alternative designs are not detailed again for brevity. By utilizing at least one switching module mentioned above, the calibration module 130 is capable of interchanging the current sources $I_A$ and $I_B$. Moreover, through the comparison method detailed in the previous embodiment, the output current of the current source $I_A$ can be calibrated to equal the output current of the current source $I_B$. Similar to the previous embodiment, the process of calibration of the current calibration apparatus in FIG. 7 may be represented as follows:

$$(I_A+I_{others,1}+X_{1)}*R_1+V_{offset}=(I_B+I_{others,2})*R_2(I_B+I_{others,1})*R_1+V_{offset}=(_A-X_2+I_{others,2})*R_2$$

Next, a synthesized compensation current configuration is determined by subtracting one of the above equations from the other.

$$I_A = I_B + (X_2R_2 - X_1R_1)/(R_1 + R_2)$$
$$= I_B + (X_2 - X_1)/2 + \delta$$
$$\delta = (X_1 + X_2)(R_2 - R_1)/2(R_1 + R_2)$$

If the resistors R1 and R2 are equivalent to each other, it will be learned from the above equation:

$$I_A = I_B + (X_2 - X_1)/2$$

$$I'_A = I_A + (X_1 - X_2)/2$$

Where, owing to various factors in practice, the resistors $R_1$ and $R_2$ barely have a change to be strictly equivalent to each other. Whereas, δ can be designed to be far less than the current deviations such that we can neglect it in the equation and obtain the above current calibration result through approximation.

Figure 8:
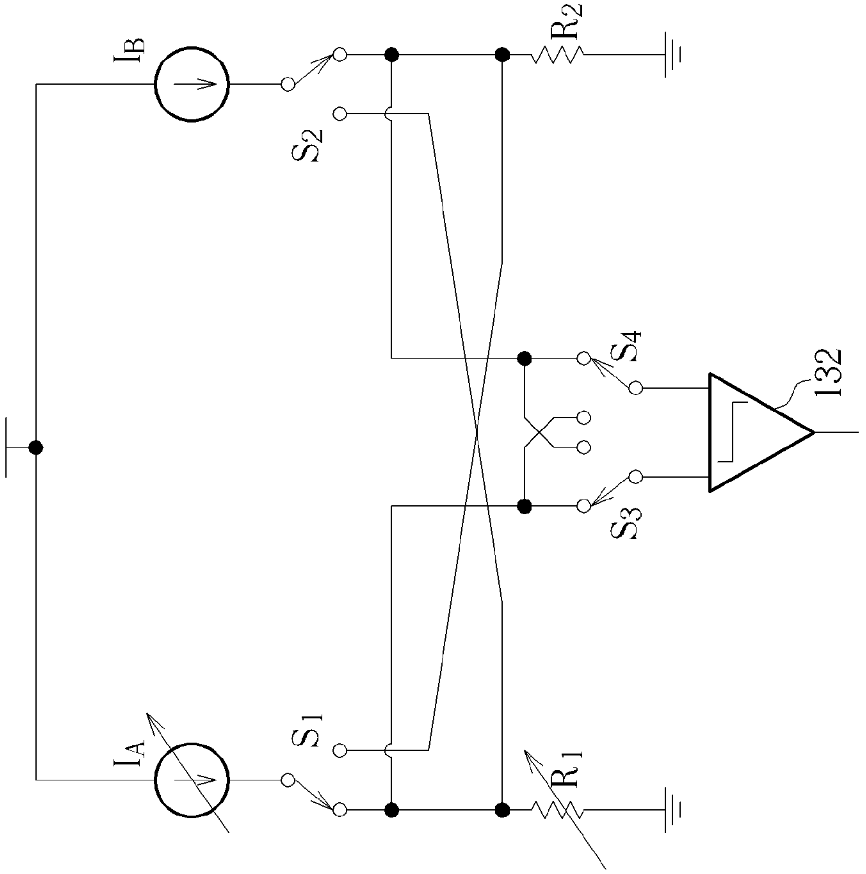
FIG. 8 is a diagram illustrating a current calibration apparatus according to a fourth embodiment of the present invention.

FIG. 8 is a diagram illustrating a current calibration apparatus according to a fourth embodiment of the present invention. This embodiment is an alternative design of at least a portion of the foregoing embodiments, wherein the current source $I_A$ can represent the at least one first current source, the current source $I_B$ can represent the at least one second current source, the at least one switching module can include the switching units $S_1$, $S_2$, $S_3$ and $S_4$. In this embodiment, the deviations of the first load (e.g. resistor $R_1$) and the second load (e.g. resistor $R_2$) can be calibrated as well. The calibration module 130 can temporarily exchange the current source $I_A$ and the current source $I_B$ via utilizing the aforementioned at least one switching module, and through the comparison method detailed in the previous embodiment, the output current of the current source $I_A$ can be calibrated to equal the output current of the current source $I_B$. Where the current source $I_A$ is a variable current source, and the aforementioned set of predetermined compensation current sources can be deemed to be built-in current sources of the current source $I_A$, namely the voltage drops of the resistors $R_1$ and $R_2$ could be calibrated to the same value by adjusting the current source $I_A$. The calibration process in this embodiment is similar to the calibration process of the aforementioned embodiment in FIG. 7, thus the similar/identical parts of this embodiment and foregoing embodiments/alternative designs are not detailed again for brevity.

Similar calibration process can be also performed upon the resistors $R_1$ and $R_2$ on the basis of the current calibration method mentioned in the embodiment. In this embodiment, by exchanging the resistors $R_1$ and $R_2$, the resistors $R_1$ and $R_2$ can be calibrated to equivalent to each other in light of the voltage comparison method utilized in the preceding embodiment. The details will be described in the following paragraph.

Figure 9:
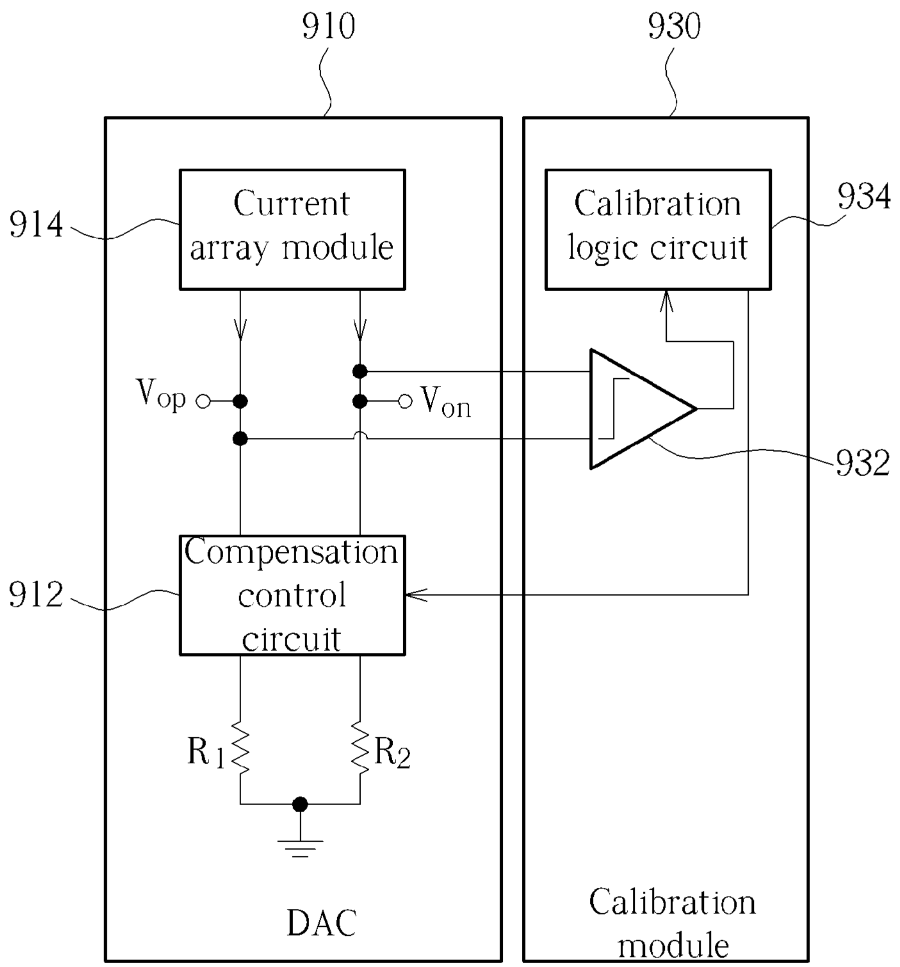
FIG. 9 is a diagram illustrating a resistance calibration apparatus according to a fifth embodiment of the present invention.

Please refer to FIG. 9, which is a diagram illustrating a resistance calibration apparatus according to a fifth embodiment of the present invention. As shown in FIG. 9, a DAC 910 includes a current array module 914, a compensation control circuit 912 and at least a first load (e.g. resistor $R_1$) and a second load (e.g. resistor $R_2$). A calibration module 930 includes a voltage comparator 932 and a calibration logic circuit 934. Those skilled in the art should understand that the current array module 914 may include a first current source and a second current source respectively inputted to the first load (e.g. resistor $R_1$) and the second load (e.g. resistor $R_2$). The compensation control circuit 912 may include a predetermined resistance compensation module and a switching module, wherein the predetermined resistance compensation module is for compensating at least one of the resistors $R_1$ and $R_2$, and the switching module is for performing switching upon the paths respectively including the first load and the second load, and the operation principle thereof resembles that of the corresponding part of the current calibration apparatus mentioned in the previous paragraphs. It should be noted that the predetermined resistance compensation module here can be carried out through methods in diversity. For instance, in respect of several predetermined compensation resistors with different resistance values, a portion of the resistors can be used to compensate at least one of the first load and the second load.

In accordance with this embodiment, similar to the aforementioned current calibration, the calibration module 930 can temporarily add at least one portion of the predetermined compensation resistance into at least one of the resistors $R_1$ and $R_2$, as well as detect the respective voltage drops of the compensated resistor $R'_1$ (including resistor $R_1$ and the corresponding compensation resistance) and resistor $R'_2$ (including resistor $R_1$ and the corresponding compensation resistance). The calibration module 930 dynamically adjusts a distribution of the at least one portion of the predetermined compensation resistance until a voltage drop of the first load (such as the resistor $R_1$) and a voltage drop of the second load (such as the resistor $R_2$) are equal to each other, and then records a first compensation resistance configuration corresponding to the current distribution of the at least one portion of the predetermined compensation resistance.

In addition, the calibration module 930 can exchange the resistors $R_1$ and $R_2$, and temporarily add at least one portion of the predetermined compensation resistance into at least one of the resistors $R_1$ and $R_2$, as well as detect the respective voltage drops of the compensated resistor $R''_1$ (including resistor $R_1$ and the corresponding compensation resistance) and resistor $R''_2$ (including resistor $R_1$ and the corresponding compensation resistance). The calibration module 930 dynamically adjusts a distribution of the at least one portion of the predetermined compensation resistance until a voltage drop of the first load (such as the resistor $R_1$) and a voltage drop of the second load (such as the resistor $R_2$) are equal to each other, and then records a second compensation resistance configuration corresponding to the current distribution of the at least one portion of the predetermined compensation resistance.

Figure 10:
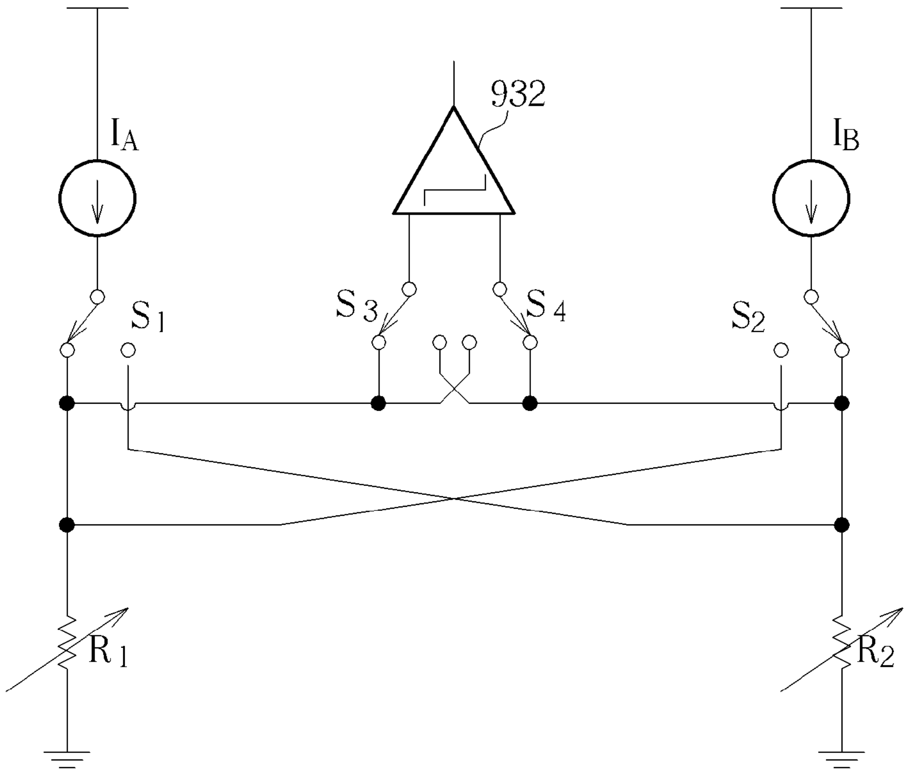
FIG. 10 is a diagram illustrating a resistance calibration apparatus according to a sixth embodiment of the present invention.

Next, the calibration module 930 can generate a resultant compensation resistance by using the compensation control circuit 912 according to the first compensation resistance configuration and the second compensation resistance configuration, for use of compensating the at least one first load (such as resistor $R_1$) or the at least one second load (such as resistor $R_2$), so as to calibrate the at least one first load and the at least one second load to be equivalent to each other FIG. 10 is a diagram illustrating a resistance calibration apparatus according to a sixth embodiment of the present invention. This embodiment is an alternative design of at least a portion of the foregoing embodiments, wherein the current source $I_A$ is representative of the aforementioned first current source, the current source $I_B$ is representative of the second current source Furthermore, the above-mentioned at least one switching module may include switching units $S_1$, $S_2$, $S_3$, and $S_4$. By utilizing the switching module mentioned above, the calibration module 930 is capable of temporarily exchanging the resistors $R_1$ and $R_2$. Moreover, through the voltage comparison method detailed in the previous embodiment, the firs load (such as resistor $R_1$) can be calibrated to be equivalent to the second load (such as resistor $R_2$). Please note that the process of calibration of the resistance calibration apparatus in FIG. 10 may be represented in brief as follows:

$$I_A*(R_1+X_1)+V_{offset}=I_B*(R_2-X_1)$$

$$I_A*(R_2+X_2)+V_{offset}=I_B*(R_1-X_2)$$

Next, a synthesized compensation resistance configuration is determined by subtracting one of the above equations from the other.

$$[R_1-R_2+X_1-X_2]*(I_A+I_B)=0$$

$$R_1=R_2+(X_2-X_1)$$

$$R'_1=R_1+(X_1-X_2)$$

That is to say, the calibration module 930 can generate the synthesized compensation resistance configuration in accordance with the first compensation resistance configuration and the second compensation resistance configuration. Then the calibration module 930 refers to the synthesized resistance configuration to control the resistance compensation module to generate the resultant compensation resistance such as the resultant resistance $(X_1-X_2)$, so as to calibrate the first load from $R_1$ to $R'_l$ thereby equaling the resistance of the second load.

Figure 11:
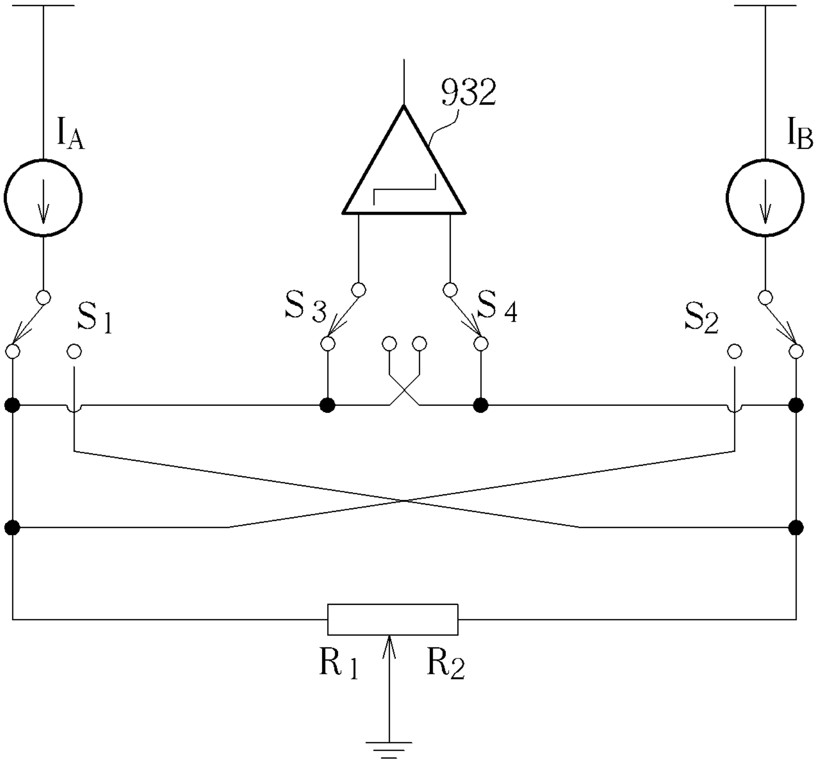
FIG. 11 is a diagram illustrating a resistance calibration apparatus according to a seventh embodiment of the present invention.

Please refer to FIG. 10 in conjunction with FIG. 11. FIG. 11 is a diagram illustrating a resistance calibration apparatus according to a seventh embodiment of the present invention. The differences between the two diagrams are implementations of the first load, the second load and the resistance compensation module, therefore FIG. 11 can be regarded as a special case in respect of the resistance calibration apparatus shown in FIG. 10. The details are omitted here for brevity.

Figure 12:
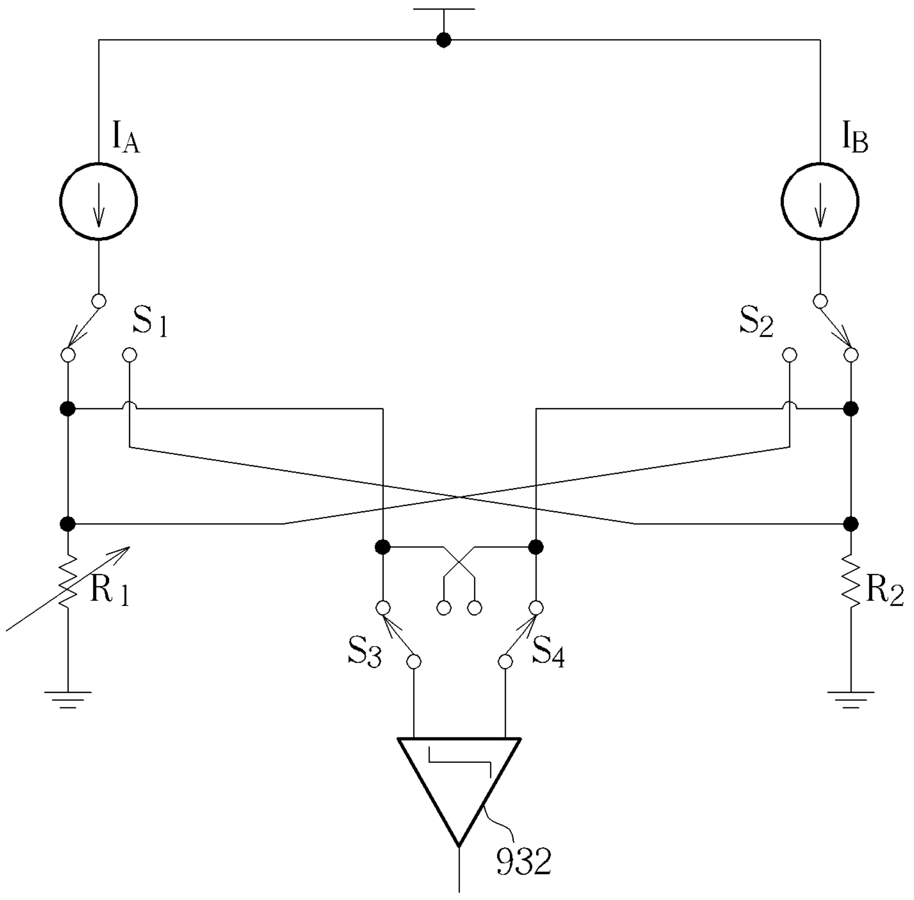
FIG. 12 is a diagram illustrating a resistance calibration apparatus according to an eighth embodiment of the present invention.

FIG. 12 is a diagram illustrating a resistance calibration apparatus according to an eighth embodiment of the present invention. In spite of the resistance calibration apparatus shown in FIG. 12 can be regarded as a special case of that of FIG. 10, the calibration processes are slightly different from each other owing to only one of the two loads is variable. The calibration is indicated as follows:

$$I_A*(R_1+X_1)+V_{offset}=I_B*R_2$$

$$I_A*R_2+V_{offset}=I_B*(R_1-X_2)$$

Next, a synthesized compensation resistance configuration is determined by subtracting one of the above equations from the other.

$$\begin{aligned} R_1 &= R_2 + (X_2 I_B - X_1 I_A)/(I_A + I_B) \\ &= R_2 + (X_2 - X_1)/2 + \delta \end{aligned}$$

$$\delta = (X_1 + X_2)(I_B - I_A)/2(I_A + I_B)$$

If the output currents of the current sources IA and IB are identical, according to the above equations, it can be derived as follows:

$$R_1=R_2+(X_2-X_i)/2$$

$$R'_1=R_1+(X_1-X_2)/2$$

Where, owing to various factors in practice, the current sources $I_A$ and $\mathbf{1}_B$ barely have a change to be strictly equivalent to each other. Whereas, δ can be designed to be far less than the resistance deviations such that we can neglect it in the equation and obtain the above resistance calibration result through approximation.

Those skilled in the art should understand either one of the aforementioned current calibration or the resistance calibration can proceed on the basis of the other. For instance in a manner in terms of performing the current calibration first, and then performing the resistance calibration by utilizing the calibrated resistance, or vice versa. Furthermore, the current calibration and the resistance calibration may be also carried out in a manner of iteration, so as to upgrade the precision to a higher level.

Those skilled in the art will readily observe that numerous modifications and alterations of the device and method may be made while retaining the teachings of the invention. Accordingly, the above disclosure should be construed as limited only by the metes and bounds of the appended claims.

What is claimed is :

1. A current calibration method, employed in an electronic device including at least one first current source and at least one second current source, comprising:

temporarily outputting an output current of the at least one first current source and an output current of the at least one second current source to a first load and a second load, respectively, so as to monitor voltage drops of the first load and the second load; temporarily injecting at least one portion of a set of predetermined compensation currents into at least one of the output current of the at least one first current source and the output current of the at least one second current source; and dynamically adjusting a distribution of the at least one portion of the set of predetermined compensation currents until a voltage drop of the first load and a voltage drop of the second load are equal to each other, and then recording a first compensation current configuration corresponding to the current distribution of the at least one portion of the set of predetermined compensation currents, wherein the set of predetermined compensation currents is generated by a set of predetermined compensation current sources, respectively;

temporarily outputting the output current of the at least one first current source and the output current of the at least one second current source to the second load and the first load, respectively, so as to monitor the voltage drops of the first load and the second load; and dynamically adjusting the distribution of the at least one portion of the set of predetermined compensation currents until the voltage drop of the first load and the voltage drop of the second load are equal to each other, and then recording a second compensation current configuration corresponding to the current distribution of the at least one portion of the set of predetermined compensation currents; and controlling the set of predetermined compensation current sources to generate a resultant compensation current according to the first compensation current configuration and the second compensation current configuration, for use of compensating the at least one first current source or the at least one second current source, so as to calibrate the at least one first current source and the at least one second current source to be equivalent to each other.

2. The current calibration method of claim 1, further comprising:

generating a synthesized compensation current configuration according to the first compensation current configuration and the second compensation current configuration, and controlling the set of predetermined compensation current sources to generate the resultant compensation current according to the synthesized compensation current configuration.

3. The current calibration method of claim 2, wherein the first compensation current configuration represents a first calibration bit configuration, and the second compensation current configuration represents a second calibration bit configuration; and the step of generating the synthesized compensation current configuration according to the first compensation current configuration and the second compensation current configuration further comprises:

performing specific calculation upon the first calibration bit configuration and the second calibration bit configuration to generate a synthesized calibration bit configuration, and utilizing the synthesized calibration bit configuration as the synthesized compensation current configuration.

4. The current calibration method of claim 1, wherein the set of predetermined compensation currents comprises a plurality of predetermined compensation currents with different values, and a portion of the plurality of predetermined compensation currents with different values is arranged for synthesizing the resultant compensation current.

5. The current calibration method of claim 4, wherein the plurality of predetermined compensation currents with different values correspond to different calibration bits, respectively.

6. The current calibration method of claim 5, wherein the first compensation current configuration represents a first calibration bit configuration, and the second compensation current configuration represents a second calibration bit configuration.

7. The current calibration method of claim 5, wherein the electronic device comprises a current steering digital-to-analog converter (current steering DAC).

8. The current calibration method of claim 7, wherein a range of compensation currents represented by the calibration bits is different from a range of a plurality of partial currents represented by a plurality of bits of the current steering DAC.

9. The current calibration method of claim 8, wherein a compensation current represented by a least significant bit (LSB) of the calibration bits is smaller than a partial current represented by an LSB of the bits of the current steering DAC.

10. A current calibration apparatus, wherein the current calibration apparatus includes at least a portion of an electronic device, and the electronic device includes at least one first current source and at least one second current source, the current calibration apparatus comprising:

a set of predetermined compensation current sources, arranged for generating a set of predetermined compensation currents;

a first load and a second load, arranged for performing current-to-voltage conversion, respectively;

at least one switching module, coupled to the at least one first current source, the at least one second current source, the first load, the second load, and the set of predetermined compensation current sources, and arranged for performing path switching; and a calibration module, coupled to the first load, the second load, and the at least one switching module, and arranged for performing calibration control, wherein the calibration module comprises:

a voltage comparator, coupled to the first load and the second load, and arranged for performing voltage comparison.

11. The current calibration apparatus of claim 10, wherein by utilizing the set of predetermined compensation current sources, the first load, the second load, the at least one switching module, and the voltage comparator, the calibration module temporarily outputs an output current of the at least one first current source and an output current of the at least one second current source to a first load and a second load, respectively, so as to monitor voltage drops of the first load and the second load, temporarily injects at least one portion of the set of predetermined compensation currents into at least one of the output current of the at least one first current source and the output current of the at least one second current source, and dynamically adjusts a distribution of the at least one portion of the set of predetermined compensation currents until a voltage drop of the first load and a voltage drop of the second load are equal to each other, and then records a first compensation current configuration corresponding to the current distribution of the at least one portion of the set of predetermined compensation currents; temporarily outputs the output current of the at least one first current source and the output current of the at least one second current source to the second load and the first load, respectively, so as to monitor the voltage drops of the first load and the second load; and dynamically adjusting the distribution of the at least one portion of the set of predetermined compensation currents until the voltage drop of the first load and the voltage drop of the second load are equal to each other, and then records a second compensation current configuration corresponding to the current distribution of the at least one portion of the set of predetermined compensation currents; and controls the set of predetermined compensation current sources to generate a resultant compensation current according to the first compensation current configuration and the second compensation current configuration, for use of compensating the at least one first current source or the at least one second current source, so as to calibrate the at least one first current source and the at least one second current source to be equivalent to each other.

12. The current calibration apparatus of claim 11, wherein the calibration module generates a synthesized compensation current configuration according to the first compensation current configuration and the second compensation current configuration, and controls the set of predetermined compensation current sources to generate the resultant compensation current according to the synthesized compensation current configuration.

13. The current calibration apparatus of claim 12, wherein the first compensation current configuration represents a first calibration bit configuration, and the second compensation current configuration represents a second calibration bit configuration; and the calibration module performs specific calculation upon the first calibration bit configuration and the second calibration bit configuration to generate a synthesized calibration bit configuration, and utilizes the synthesized calibration bit configuration as the synthesized compensation current configuration.

14. The current calibration apparatus of claim 11, wherein the set of predetermined compensation currents comprises a plurality of predetermined compensation currents with different values, and a portion of the plurality of predetermined compensation currents with different values is arranged for synthesizing the resultant compensation current.

15. The current calibration apparatus of claim 14, wherein the plurality of predetermined compensation currents with different values correspond to different calibration bits, respectively.

16. The current calibration apparatus of claim 15, wherein the first compensation current configuration represents a first calibration bit configuration, and the second compensation current configuration represents a second calibration bit configuration.

17. The current calibration apparatus of claim 15, wherein the electronic device comprises a current steering digital-to-analog converter (current steering DAC).

18. The current calibration apparatus of claim 17, wherein a range of compensation currents represented by the calibration bits is different from a range of a plurality of partial currents represented by a plurality of bits of the current steering DAC.

19. The current calibration apparatus of claim 18, wherein a compensation current represented by a least significant bit (LSB) of the calibration bits is smaller than a partial current represented by an LSB of the bits of the current steering DAC.

20. A resistance calibration method, employed in an electronic device including at least one first load and at least one second load, comprising:

temporarily outputting an output current of a first current source and an output current of a second current source to the at least one first load and the at least one second load, respectively, so as to monitor voltage drops of the at least one first load and the at least one second load; temporarily adding at least one portion of a predetermined compensation resistance provided by a predetermined compensation resistance module into at least one of the at least one first load and the at least one second load; and dynamically adjusting a distribution of the at least one portion of the predetermined compensation resistance until a voltage drop of the first load and a voltage drop of the second load are equal to each other, and then recording a first compensation resistance configuration corresponding to the current distribution of the at least one portion of the predetermined compensation resistance;

temporarily outputting the output current of the first current source and the output current of the second current source to the at least one second load and the at least one first load, respectively, so as to monitor the voltage drops of the at least one first load and the at least one second load; and dynamically adjusting the distribution of the at least one portion of the predetermined compensation resistance until the voltage drop of the at least one first load and the voltage drop of the at least one second load are equal to each other, and then recording a second compensation resistance configuration corresponding to the current distribution of the at least one portion of the predetermined compensation resistance; and controlling the predetermined compensation resistance module to generate a resultant compensation resistance according to the first compensation resistance configuration and the second compensation resistance configuration, for use of compensating the at least one first load or the at least one second load, so as to calibrate the at least one first load and the at least one second load to be equivalent to each other.

21. The resistance calibration method of claim 20, further comprising:

generating a synthesized compensation resistance configuration according to the first compensation resistance configuration and the second compensation resistance configuration, and controlling the predetermined compensation resistance module to generate the resultant compensation resistance according to the synthesized compensation resistance configuration.

22. The resistance calibration method of claim 20, wherein the predetermined compensation resistance module comprises a plurality of predetermined compensation resistors with different values, and a portion of the plurality of predetermined compensation resistors with different values is arranged for synthesizing the resultant compensation resistance.

23. The resistance calibration method of claim 22, wherein the electronic device comprises a current steering digital-to-analog converter (current steering DAC).

24. A resistance calibration apparatus, wherein the resistance calibration apparatus includes at least a portion of an electronic device, and the electronic device includes at least one first load and at least one second load, the resistance calibration apparatus comprising:

a predetermined compensation resistance module, arranged for generating predetermined compensation resistance;

a first current source and a second current source, arranged for performing resistance-to-voltage conversion, respectively;

at least one switching module, coupled to the at least one first load, the at least one second load, the first current source, the second current source, and the predetermined compensation resistance module, and arranged for performing path switching; and a calibration module, coupled to the at least one first load, the at least one second load, the predetermined compensation resistance module and the at least one switching module, and arranged for performing calibration control, wherein the calibration module comprises:

a voltage comparator, coupled to the at least one first load and the at least one second load, and arranged for performing voltage comparison.

25. The resistance calibration apparatus of claim 24, wherein by utilizing the predetermined compensation resistance module, the first current source, the second current source, the at least one switching module, and the voltage comparator, the calibration module temporarily outputs an output current of the at first current source and an output current of the second current source to the at least one first load and the at least one second load, respectively, so as to monitor voltage drops of the at least one first load and the at least one second load, temporarily adds at least one portion of the predetermined compensation resistance into at least one of the at least one first load and the at least one second load, and dynamically adjusts a distribution of the at least one portion of the predetermined compensation resistance until a voltage drop of the first load and a voltage drop of the second load are equal to each other, and then records a first compensation resistance configuration corresponding to the current distribution of the at least one portion of the predetermined compensation resistance; temporarily outputs the output current of the first current source and the output current of the second current source to the at least one second load and the at least one first load, respectively, so as to monitor the voltage drops of the at lest one first load and the at least one second load; and dynamically adjusting the distribution of the at least one portion of the predetermined compensation resistance module until the voltage drop of the at least one first load and the voltage drop of the at least one second load are equal to each other, and then records a second compensation resistance configuration corresponding to the current distribution of the at least one portion of the predetermined compensation resistance; and controls the predetermined compensation resistance module to generate a resultant compensation resistance according to the first compensation resistance configuration and the second compensation resistance configuration, for use of compensating the at least one first load or the at least one second load, so as to calibrate the at least one first load and the at least one second load to be equivalent to each other.

26. The resistance calibration apparatus of claim 24, wherein the calibration module generates a synthesized compensation resistance configuration according to the first compensation resistance configuration and the second compensation resistance configuration, and controls the predetermined compensation resistance module to generate the resultant compensation resistance according to the synthesized compensation resistance configuration.

27. The resistance calibration apparatus of claim 24, wherein the predetermined compensation resistance module comprises a plurality of predetermined compensation resistors with different values, and a portion of the plurality of predetermined compensation resistors with different values is arranged for synthesizing the resultant compensation resistance.

28. The resistance calibration apparatus of claim 27, wherein the electronic device comprises a current steering digital-to-analog converter (current steering DAC).

* * * * *